United States Patent [19]

Velo

[11] Patent Number: 4,467,192
[45] Date of Patent: Aug. 21, 1984

[54] OPTICAL RECEIVER

[75] Inventor: Henri J. Velo, Hilversum, Netherlands

[73] Assignee: U.S. Philips Corporation, New York, N.Y.

[21] Appl. No.: 346,704

[22] Filed: Feb. 8, 1982

[30] Foreign Application Priority Data

Feb. 26, 1981 [NL] Netherlands ............... 8100929

[51] Int. Cl.$^3$ ............................................. H01J 40/14
[52] U.S. Cl. ............................. 250/214 A; 455/619; 250/214 AG
[58] Field of Search ................. 315/149, 150, 158; 455/619; 250/214 A, 214 AG; 324/123 R, 123 C; 356/73.1; 330/69

[56] References Cited

U.S. PATENT DOCUMENTS 4,051,363 9/1977 Fish ............................. 455/619 X
4,234,253 11/1980 Higginbotham et al. .......... 356/73.1

OTHER PUBLICATIONS

Campbell et al., "T3 Rate Fiber Optic Terminal Equipment", Intercon 79 Exposition Proceedings, Dallas, Feb.–Mar. 1979, p. 180.

*Primary Examiner*—Eugene R. LaRoche
*Assistant Examiner*—Vincent DeLuca
*Attorney, Agent, or Firm*—Thomas A. Briody; William J. Streeter; Joseph P. Abate

[57] ABSTRACT

An optical receiver comprises a photodiode (1) which is connected to a biasing circuit (2), and also to the output (14) of the receiver via the series arrangement formed by a preamplifier (3), a control amplifier 4 and an output amplifier (5), the output of the receiver being connected to the control input 10 of the control amplifier (4) via a detector (6) and a differential amplifier (9). The control amplifier (4) is what is commonly referred to as a differential controller, in which alternating current and direct current are processed in the same manner. As a consequence thereof, it is possible to determine the optical input level of the receiver continuously at the output of the control amplifier by means of a simple ammeter (8).

5 Claims, 5 Drawing Figures

OPTICAL RECEIVER

BACKGROUND OF THE INVENTION

The invention relates to an optical receiver comprising a photodiode connected to a biasing circuit. The photodiode is further connected to an output of the receiver via a series arrangement of a preamplifier, a control amplifier and an output amplifier whose output is connected via a detector to one input of a differential amplifier which has another input connected to a source of reference voltage and which also has an output connected to a control input of the control amplifier.

In such optical receivers the possibility of measuring the optical input level during operation is very much desired. This makes it possible to measure the attenuation of the connection (optical fiber cable welded joints and optical plugs) during the initial test procedure of an optical communication system. This is of great advantage as otherwise, when testing the optical input signal, the optical connection between the cable and the optical receiver must be interrupted. In addition, it is possible to carry out maintenance tests during operation to measure any change in the optical input level and, acting thus, to have the possibility of taking corrective measures at an early stage.

In this case there is the additional possibility of detecting any aging of the glass fiber cable, and, as the case may be, of connecting an alarm thereto.

SUMMARY OF THE INVENTION

It is an object of the invention to provide an optical receiver in which the level of an optical input to a receiver can be determined in a very simple manner during operation.

The invention provides an optical receiver as described in the opening paragraph characterized in that the control amplifier comprises a current splitter having two outputs which are coupled to respective inputs of an adder circuit; that a signal input of the current splitter is connected to an adjustable direct current source and also to an output of the preamplifier via a first capacitor; that an output of the adder circuit is connected to the input of the output amplifier via a second capacitor and also to a first test point via a first resistor, and that the test point is connected to a point of constant potential via a decoupling third capacitor.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 1:
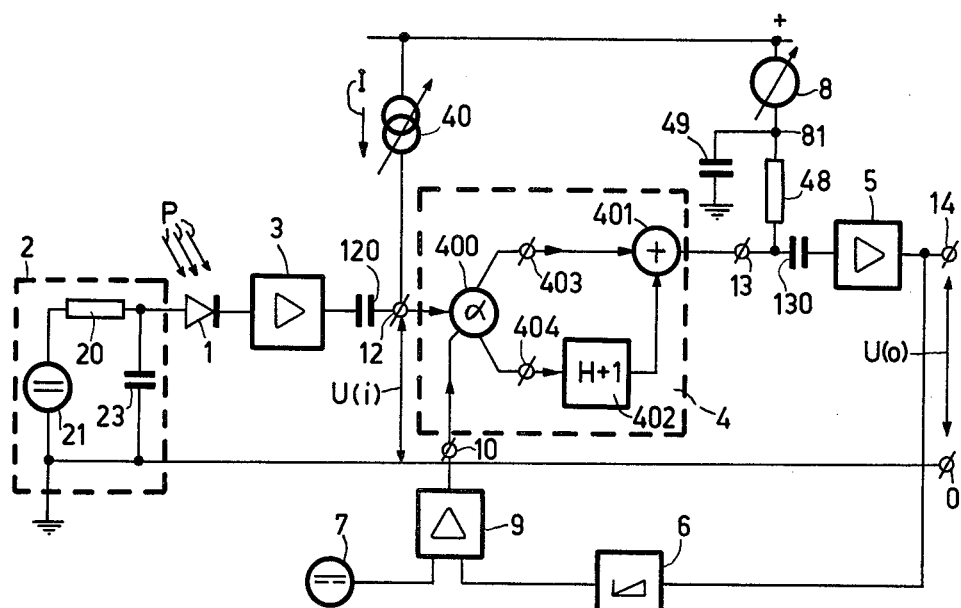
FIG. 1 is a schematic circuit diagram which shows an optical receiver in accordance with the invention.

In the optical receiver shown in FIG. 1, a photodiode 1 is biased by a biasing circuit 2. The biasing circuit 2 comprises a temperature-dependent reference source 21 which is connected to the photodiode 1 via a high-ohmic resistor 20. The cathode of the photodiode 1 is connected to an input of a preamplifier 3 whose output is connected to a signal input 12 of a control amplifier 4 via a capacitor 120. In addition, the signal input 12 is connected to an adjustable direct current source 40. An output 13 of the control amplifier 4 is connected to an input of an output amplifier 5 via a capacitor 130. An output of the output amplifier 5 is connected to one input of a differential amplifier 9 via a detector 6 and to an output 14 of the receiver. The other input of the differential amplifier 9 is connected to a reference voltage source 7. An output of the differential amplifier 9 is connected to a control input 10 of the control amplifier 4. The output 13 of the control amplifier 4 is connected to a test point 81 via a resistor 48. The test point 81 is connected to a point of constant potential, in this case ground, via a decoupling capacitor 49. An ammeter 8 is connectable between the test point 81 and a point of constant potential (+). The signal input 12 of the control amplifier 4 is connected to an input of a current splitter 400. A first output 403 of the cuapplied to the input of the preamplifier 3, it is amplified many times by the mechanism of ionization collision in the diode itself. For a maximum signal-to-noise ratio, it is necessary that the multiplication factor M of the photodiode 1 has a defined value which depends on the value of the primary photocurrent P. In order to maintain the highest possible signal-to-noise ratio for different optical input levels, the multiplication factor M of the photodiode 1 must be approximately inversely proportional to the cube root of the primary photocurrent P. If the primary photocurrent P increases, the current through the photodiode 1 will also increase. In response thereto, the voltage drop across the resistor 20 will increase and the voltage drop across the photodiode will decrease and the gain M of the photodiode 1 will be automatically reduced. Conversely, if the photocurrent P decreases, the voltage drop across the resistor 20 will decrease and consequently the voltage drop across the photodiode 1 will increase. The gain M of the photodiode 1 will then automatically increase. For a predetermined optical input level, a constant amplification of the photodiode 1 at different temperatures is required. It is necessary, therefore, that the reference voltage 21 has a temperature coefficient such that the gain of the photodiode remains constant. To this end, a second avalanche photodiode may, for example, be used as the temperature-dependent reference source 21.

From the foregoing it can be seen that, for a change of ydB in the primary photocurrent P, the multiplication factor M should change by $-\frac{1}{3}.y.dB$. This reduces the level variation at the input of the preamplifier to $\frac{2}{3}.y.dB$. Since the control amplifier 4 ensures that the output signal U(o) at the output 14 remains constant, this means that the gain of the control amplifier 4 must change by an amount $-\frac{2}{3}.y.dB$. In view of the fact that a given optimum gain M is associated with each value of the optical current P, the control ammplifier 4 will also have a given defined gain to bring U(o) to the required value. Thus, if the gain of the control amplifier 4 is known, it is possible to deduce the value of the primary photocurrent P therefrom.

The input current of the current splitter 400 is formed by the sum of a direct current I produced by the current source 40 and the information current i obtained from the input signal u(i) at the input 12 of the control amplifier 4. This current (I+i) distributes itself over the two outputs 403 and 404 of the current splitter 400 in dependence on the control voltage produced by the differential amplifier 9. The respective currents on the two outputs 403 and 404 of the current splitter 4 amount to:

$$I(403) = \alpha \cdot (I+i)$$
$$I(404) = (1-\alpha) \cdot (I+i) \text{ wherein } 0 < \alpha < 1. \quad (1)$$

The voltage at the output 13 of the control amplifier 4 is $$U(O) = (I+i) \cdot R(13) \cdot [1 + (1-\alpha) \cdot H] \quad (2)$$

wherein R(13) is the output resistance of the control amplifier 4 and H is a dimensionless factor which is, for example, determined by the ratio between two resistors. The output a.c. voltage at the point 13 is $$u(o) = i \cdot R(13) \cdot [1 + (1-\alpha) \cdot H]. \quad (3)$$

The input alternating current at the input 12 of the control amplifier 4 is given by:

$$i = u(i)/R(12) \quad (4)$$

wherein R(12) is the input resistance of the control amplifier 4 and u(i) the input a.c. voltage at the signal input 12 of the control amplifier 4. From the relations (3) and (4) it follows that $$\frac{u(o)}{u(i)} = \frac{R(13)}{R(12)} \cdot [1 + (1-\alpha) \cdot H]. \quad (5)$$

The direct current flowing through the ammeter 8 amounts to $$I(8) = I \cdot R(13) \cdot \frac{1 + (1-\alpha) \cdot H}{R(48) + R(8)}; R_{13} << R(48) + R(8), \quad (6)$$

wherein R(48) is the resistance value of the resistor 48 and R(8) the resistance of the ammeter. A comparison of the relations (5) and (6) shows that the ammeter indication is proportional to the gain u(o)/u(i) of the control amplifier 4. So, by providing the ammeter 8 with a suitable scale, the gain of the control amplifier 4 can be read and consequently also the primary photocurrent P of the optical receiver. The choice of a type of control amplifier in which the signal is processed in the same manner for alternating current and for direct current makes it possible to determine the optical input level of a receiver continuously by means of a simple ammeter.

Figure 2:
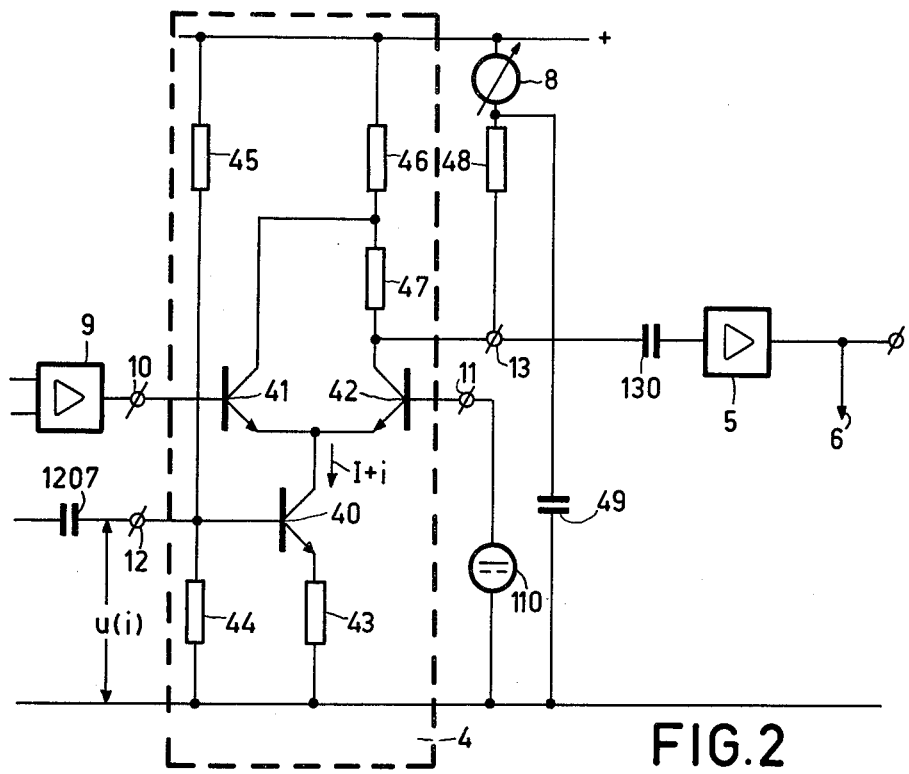
FIG. 2 is a schematic circuit diagram which shows a first embodiment of the control amplifier in accordance with the invention.

FIG. 2 shows a first embodiment of the control amplifier 4 of FIG. 1. In the control amplifier 4, the control input 10 is connected to a source of reference voltage 110 via the base-emitter path of a first transistor 41 and the emitter-base path of a second transistor 42. The junction between the emitters of the transistors 41 and 42 is connected to a first supply point 0 via the series arrangement of the collector-emitter path of a third transistor 40 and an emitter resistor 43. The base of the third transistor 40 is connected to the signal input 12 of the control amplifier 4 and is also connected to the junction between two resistors 44 and 45 which are arranged in series between the first supply point (0) and a second supply point (+). The collector of the second transistor 42 is connected to the second supply point (+) via a series arrangement of two resistors 47 and 46. The junction of the two resistors 46 and 47 is connected to the collector of the first transistor 41.

The collector current of transistor 40 is formed by the sum of a direct current I having superposed thereon the information current i obtained from the input signal u(i) at the signal input 12 of the control amplifier 4. This current (I+i) is distributed between the two transistors 41 and 42 in dependence on the control voltage produced by the differential amplifier 9. The respective collector currents of the two transistors 41 and 42 amount to:

$$I(41) = \alpha \cdot (I+i),$$
$$I(42) = (1-\alpha) \cdot (I+i) \text{ wherein } 0 < \alpha < 1. \quad (1)$$

The voltage across the series arrangement of the resistors 46 and 47 amounts to:

$$U(o) = (I+i) \cdot [R(46) + (1-\alpha) \cdot R(47)], \quad (2)$$
$$= R(46) \cdot (I+i) \cdot [1 + (1-\alpha) \cdot H],$$

wherein H = (47)/R(46), R(46) is the resistance value of the resistor 46 and R(47) is the resistance value of the resistor 47. Then the output a.c. voltage at the point 13 amounts to $$u(o) = i \cdot R(46) \cdot [1 + (1-\alpha) \cdot H]. \quad (3)$$

The alternating current i is given by $$i = u(i)/R(43), \quad (4)$$

wherein R(43) is the resistance value of the resistor 43 and u(i) the input a.c. voltage at the signal input 12 of the control amplifier 4. From the expressions (3) and (4), the following relation may be desired $$\frac{u(o)}{u(i)} = \frac{R(46)}{R(43)} \cdot [1 + (1-\alpha) \cdot H]. \quad (5)$$

The direct current flowing through the ammeter 8 amounts to $$I(8) = I \cdot \frac{R(46)}{R(48) + R(8)} \cdot [1 + (1-\alpha) \cdot H], \quad (6)$$

wherein R(48) >> R(46) + R(47) and wherein R(48) is the resistance value of the resistor 48 and R(8) the resistance of the ammeter. When the expressions (5) and (6) are compared it can be seen that the ammeter reading is proportional to the gain u(o)/u(i) of the control amplifier 4.

Figure 3:
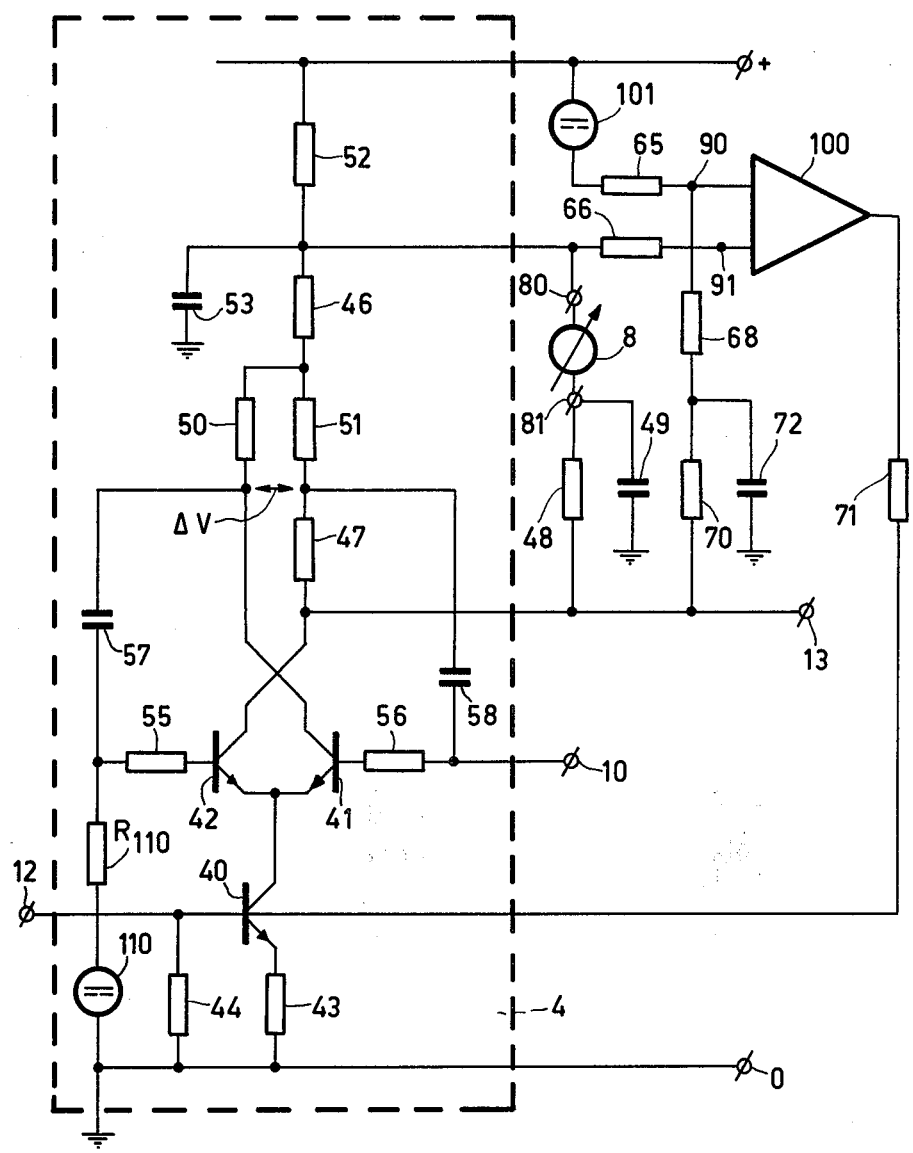
FIG. 3 is a schematic circuit diagram which shows a second embodiment of the control amplifier in accordance with the invention.

FIG. 3 shows a second embodiment of the control amplifier 4 of FIG. 1 in which compensation measures have been taken at the same time to increase the measuring accuracy. The measuring inaccuracy is caused by noise occurring at the input of the amplifier 3, which noise originates from the photodiode 1 at the input stage of the amplifier 3. For a maximum signal-to-noise ratio, it is necessary that the multiplication factor M of the avalanche diode 1 has a defined value which depends on the optical input level. This defined value can only be realized approximately by means of the biasing circuit 2.

The base of the first transistor 41 is connected to the control input 10 of the control amplifier 4 via a stopper resistor 56. The base of the second transistor 42 is connected to the reference voltage source 110 via a stopper resistor 55 and a resistor R 110. The emitters of the two transistors 41 and 42 are jointly connected to the first supply point via the series arrangement of the collector/emitter path of the third transistor 40 and the emitter resistor 43. The base of the third transistor 40 is connected to the signal input 12 and also via the resistor 44 to the first supply point 0. The collector circuit of the second transistor 42 comprises the series arrangement of four resistors 47, 51, 46 and 52, the last-mentioned resistor 52 being connected to the second supply point (+). The collector of the first transistor 41 is connected to the junction of the resistors 51 and 46 via the resistor 50 and is also connected to the resistor R 110 via a capacitor 57. The control input 10 is connected to the junction of the resistors 51 and 47 via a capacitor 58. The series arrangement of a resistor 48 and test points 81 and 80, for the connection of an ammeter 8, is provided between the collector of the second transistor and the junction of the resistors 46 and 52. Test point 81 is connected to the first supply point via a capacitor 49. Test point 80 is connected to a first input 91 of a differential amplifier 100 via a resistor 66. A second input 90 of the differential amplifier 100 is connected to the second supply point (+) via the series arrangement of a resistor 65 and a reference voltage source 101. The input 90 of the differential amplifier 100 is connected to the collector of the second transistor 42 via the series arrangement of two resistors 68 and 70. An output of the differential amplifier 100 is connected to the base of the third transistor 40 via a resistor 71.

The junction of the resistors 68 and 70 is connected to the first supply point 0 via a capacitor 72. The junction of the resistors 52 and 46 is connected to the first supply point 0 via a capacitor 53.

As shown in FIG. 3, the control amplifier 4 is of the type disclosed in U.K. patent application No. 2064249A. With the aid of the voltage drop across the two resistors 50 and 51, the influence of the what are commonly referred to as bulk resistances of the two transistors 41 and 42 is eliminated. These bulk resistances appear in the base circuit and the emitter circuit of the two transistors 41 and 42. The sum of the two resistances may be considered to be concentrated in the emitter circuits of the two transistors 41 and 42, as described in detail in the cited U.K. patent application. Because of said bulk resistances, the ammeter current does not vary fully proportionally to the gain of the control amplifier 4. By eliminating the influence of these bulk resistances, the meter reading is more nearly proportional to the gain of the control amplifier 4. This is achieved by making the voltage Δv between the two resistors 50 and 51 equal to the voltage across the bulk resistances of the transistors 41 and 42. The improvement in the second-order distortion of said control amplifier 4 is here an advantageous side-product, which also compensates for the inductances in the emitter leads of the two transistors 41 and 42 by the parasitic inductances of the two resistors 50 and 51. The resistors 55 and 56 in the base leads of the two transistors 42 and 41 are provided to reduce the possibility of high-frequency oscillations occurring.

The control amplifier shown in FIG. 3 has very good high-frequency properties and is suitable for use at frequencies up to 500 MHz. The differential amplifier 100, and the reference source 101 with associated resistors and capacitors are provided to increase the measuring accuracy of ammeter 8. It must then of necessity be ensured that the sum of the currents $\alpha I$ and $(1-\alpha) I$ remains constant. To this end, the voltage across the resistor 52 is made equal to the voltage between the second supply point (+) and the input 90 of the differential amplifier 100. So the voltage at the input 90 of the differential amplifier 100 determines the magnitude of the current I and is equal to the magnitude of the voltage of the reference source 101 plus the voltage drop across the resistor 65. The voltage drop across the resistor 65 depends on the distribution factor $\alpha$ of the control amplifier 4 and is largest when the collector current of transistor 40 flows wholly through the transistor 42. Instead of being connected to the input 90 of the differential amplifier 100, the resistor 68 may alternatively be connected to the input 91 of the differential amplifier 100. In that case, a correction in the opposite sense is performed.

Figure 4:
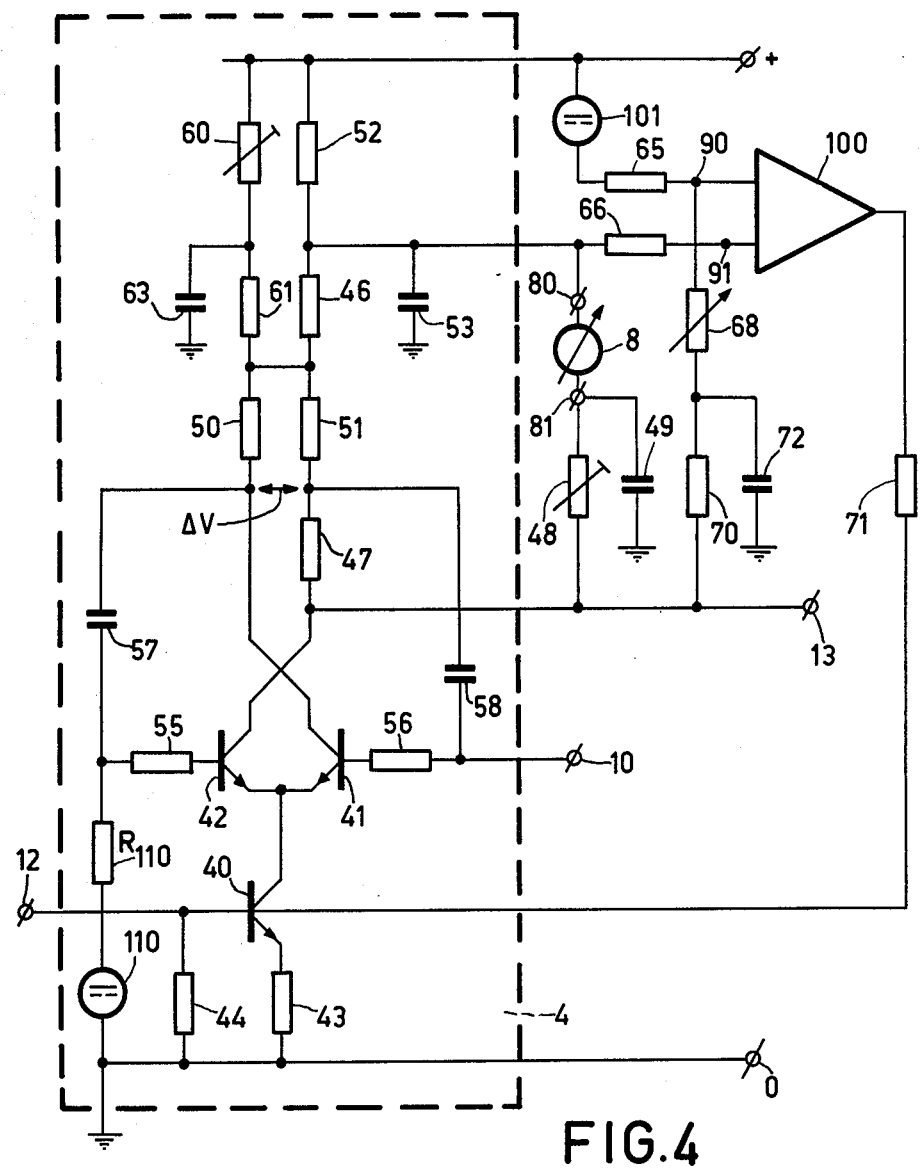
FIG. 4 is a schematic circuit diagram which shows a third embodiment of the control amplifier in accordance with the invention.
Figure 5:
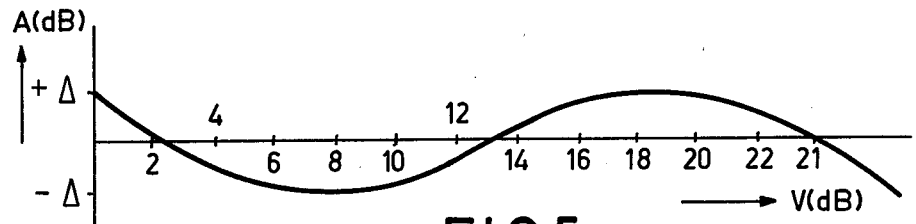
FIG. 5 is a measuring diagram which is realized by means of the arrangement shown in FIG. 4.

In the embodiment shown in FIG. 4, the measuring accuracy can be increased still further. The implementation of this embodiment differs in three respects from the embodiment shown in FIG. 3. The resistor 48 between the test point 81 and the output 13 is variable. The resistor 68 between the input 90 of the differential amplifier 100 and the resistor 70 is also variable. The series arrangement of a resistor 61 and a variable resistor 60 is provided between the second supply point and the junction of the two resistors 50 and 51. The resistor 60 may alternatively be connected to the first supply point 0, which results in a correction in the opposite sense. The junction of the resistors 60 and 61 is connected via a capacitor 63 to the first supply point 0. With the aid of the three variable resistors 48, 60 and 68, the deviation in the reading of the ammeter 8 can be rendered zero in three positions in the control range of the control amplifier, as is shown schematically in FIG. 5. So it is, for example, possible to make the deviation of the meter equal to zero at the beginning, at the end and in the center of this control range, as shown in FIG. 5. The gain V of the control amplifier 4 is plotted in dB on the horizontal axis and the meter correction A in dB is plotted on the vertical axis.

What is claimed is:

1. An optical receiver comprising a photodiode connected to a biasing circuit, the photodiode being further connected to an output of the receiver via a series arrangement of a preamplifier, a control amplifier and an output amplifier, the output amplifier having an output connected via a detector to one input of a first differential amplifier, the first differential amplifier having another input connected to a first reference voltage source, the first differential amplifier also having an output connected to a control input of the control amplifier, characterized in that the control amplifier further comprises a current splitter having two outputs which are coupled to respective inputs of an adder circuit, that a signal input of the current splitter is connected to an adjustable direct current source and also to an output of the preamplifier via a first capacitor, that an output of the adder circuit is connected to an input of the output amplifier via a second capacitor and also to a first test point via a first resistor, and that the first test point is connected to a point of constant potential via a decoupling third capacitor.

2. An optical receiver as claimed in claim 1, characterized in that the current splitter comprises a first transistor and a second transistor the emitters of which are interconnected by a junction, the junction of the emitters being connected to a first supply point via the collector-emitter path of a third transistor, the base of the third transistor forming a signal input of the control amplifier, the base of the first transistor forming the control input of the control amplifier, that there is provided in the collector circuit of the second transistor a voltage divider formed by second and third resistors which form the adder circuit, that the collector of the first transistor is connected to a point on the voltage divider, and that the collector of the second transistor forms the output of the adder circuit.

3. An optical receiver as claimed in claim 2, characterized in that the voltage divider comprises a series arrangement of second, third, fourth and fifth resistors, that the base of the first transistor is connected to the control input via a first stopper resistor, that the base of the second transistor is connected to a second reference voltage source via a second stopper resistor, that the collector of the first transistor is connected to the second reference voltage source via a fourth capacitor and also to a junction point of the third and fourth resistors of the voltage divider via a sixth resistor, and that the control input is connected to a junction point of the second and fourth resistors of the voltage divider via a fifth capacitor.

4. An optical receiver as claimed in claim 2 or 3, characterized in that between the collector of the second transistor and the voltage divider there are provided one after the other the first resistor and first and second test points, the first and second test points being connected to the first supply point via third and sixth capacitors, the second test point being further connected via a seventh resistor to a first input of a second differential amplifier, that a second input of the second differential amplifier is connected to a second supply point via an eighth resistor and a third reference voltage source, that a series arrangement of ninth and tenth resistors is provided between the second input of the second differential amplifier and the collector of the second transistor, and that an output of the second differential amplifier is coupled to the base of the third transistor.

5. An optical receiver as claimed in claim 4, characterized in that the ninth resistor and the first resistor are variable, and that the sixth resistor in the collector circuit of the first transistor is connected to the second supply point via an eleventh resistor and a variable twelfth resistor, a junction point of the eleventh and variable twelfth resistors being connected to the first supply point via a seventh capacitor.

* * * * *